United States Patent
Kosa et al.

(10) Patent No.: US 7,681,173 B2
(45) Date of Patent: Mar. 16, 2010

(54) MASK DATA GENERATION METHOD AND MASK

(75) Inventors: Nobue Kosa, Tokyo (JP); Tadao Yasuzato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 420 days.

(21) Appl. No.: 11/715,463

(22) Filed: Mar. 8, 2007

(65) Prior Publication Data

US 2007/0212620 A1    Sep. 13, 2007

(30) Foreign Application Priority Data

Mar. 9, 2006    (JP)    ............................. 2006-064224

(51) Int. Cl.
*G06F 17/50*    (2006.01)
*G06F 19/00*    (2006.01)
*G03F 1/00*    (2006.01)
*G21K 5/00*    (2006.01)

(52) U.S. Cl. ............................. 716/21; 716/9; 716/10; 430/5; 378/35; 700/98; 700/120; 700/121

(58) Field of Classification Search .................... 716/9, 716/10, 21; 700/98, 120, 121; 430/5; 378/35
See application file for complete search history.

(56) References Cited

U.S. PATENT DOCUMENTS

| | | | | |
|---|---|---|---|---|
| 5,998,070 | A * | 12/1999 | Lee ................................ | 430/5 |
| 6,168,891 | B1 * | 1/2001 | Shibata ......................... | 430/30 |
| 6,416,907 | B1 * | 7/2002 | Winder et al. ................... | 430/5 |
| 6,453,457 | B1 * | 9/2002 | Pierrat et al. ................... | 716/19 |
| 6,539,521 | B1 * | 3/2003 | Pierrat et al. ................... | 716/4 |
| 6,570,174 | B1 * | 5/2003 | Tounai et al. ........... | 250/559.26 |
| 6,574,784 | B1 * | 6/2003 | Lippincott et al. .............. | 716/8 |
| 6,620,561 | B2 * | 9/2003 | Winder et al. ................... | 430/5 |
| 6,727,026 | B2 * | 4/2004 | Kuji et al. ....................... | 430/5 |
| 6,777,138 | B2 * | 8/2004 | Pierrat et al. ................... | 430/5 |
| 6,792,590 | B1 * | 9/2004 | Pierrat et al. ................... | 716/19 |
| 6,817,003 | B2 * | 11/2004 | Lippincott et al. .............. | 716/8 |
| 6,857,109 | B2 * | 2/2005 | Lippincott ...................... | 716/2 |
| 6,918,104 | B2 * | 7/2005 | Pierrat et al. ................... | 716/19 |
| 7,000,208 | B2 * | 2/2006 | Zhang ........................... | 716/11 |
| 7,003,757 | B2 * | 2/2006 | Pierrat et al. ................... | 716/19 |
| 7,058,923 | B2 * | 6/2006 | Tounai et al. ................... | 716/19 |
| 7,181,721 | B2 * | 2/2007 | Lippincott et al. ............. | 716/21 |
| 7,266,801 | B2 * | 9/2007 | Kotani et al. ................... | 716/21 |
| 7,281,234 | B2 * | 10/2007 | Lippincott ..................... | 716/19 |
| 7,332,250 | B2 * | 2/2008 | Misaka ............................ | 430/5 |

(Continued)

FOREIGN PATENT DOCUMENTS

| | | |
|---|---|---|
| JP | 3-71133 | 3/1991 |
| JP | 5-2261 | 1/1993 |
| JP | 6-242594 | 9/1994 |
| JP | 2004-348118 | 12/2004 |

*Primary Examiner*—Phallaka Kik
(74) *Attorney, Agent, or Firm*—McGinn IP Law Group, PLLC

(57) ABSTRACT

In a mask data generation method, when auxiliary patterns are arranged with respect to a device pattern, an arrangement rule for a tip of the device pattern is designed to be different from that for other portions. For portions that are corrected to a large extent by an OPC process, such as the tip of the device pattern, an auxiliary pattern is spaced at an increased distance from the device pattern. Specifically, a distance at which an auxiliary pattern is spaced from the tip of the device pattern is set to be longer than a distance at which an auxiliary pattern is spaced from a long side of the device pattern.

20 Claims, 8 Drawing Sheets

U.S. PATENT DOCUMENTS

| | | | |
|---|---|---|---|
| 2001/0024758 A1* | 9/2001 | Kuji et al. | 430/5 |
| 2002/0160278 A1* | 10/2002 | Winder et al. | 430/5 |
| 2004/0019869 A1* | 1/2004 | Zhang | 716/11 |
| 2004/0230930 A1* | 11/2004 | Lippincott et al. | 716/8 |
| 2004/0265708 A1* | 12/2004 | Misaka | 430/5 |
| 2005/0044522 A1* | 2/2005 | Maeda | 716/18 |
| 2005/0064302 A1* | 3/2005 | Kotani et al. | 430/5 |
| 2005/0193364 A1* | 9/2005 | Kotani et al. | 716/21 |
| 2005/0235245 A1* | 10/2005 | Kotani et al. | 716/19 |
| 2006/0269848 A1* | 11/2006 | Setta | 430/5 |
| 2007/0212620 A1* | 9/2007 | Kosa et al. | 430/5 |
| 2007/0266365 A1* | 11/2007 | Kawamoto | 716/21 |
| 2008/0028352 A1* | 1/2008 | Birch et al. | 716/12 |
| 2008/0138722 A1* | 6/2008 | Sugimoto | 430/5 |

* cited by examiner

MASK DATA GENERATION METHOD AND MASK

This application claims priority to prior Japanese patent application JP2006-64224, the disclosure of which is incorporated herein by reference.

BACKGROUND OF THE INVENTION

1. Field of the Invention

The present invention relates to a mask used for a lithography process to manufacture a semiconductor device, and more particularly to a mask having auxiliary patterns and a mask data generation method for such a mask.

2. Description of the Related Art

As semiconductor devices have been highly integrated, device patterns have been enhanced in fineness. For example, a dynamic random access memory (DRAM) having a minimum dimension not more than 100 nm and a capacity of 1 gigabit has practically been used. Optical lithography technology serves as an engine of this enhancement of fineness.

In the field of optical lithography, application of recent super-resolution technology has allowed formation of a fine pattern having a size not more than a half of a wavelength of light. Particularly, in a dense pattern such as a line-and-space pattern, in which lines and spaces are repeated at constant pitches, a sufficient depth of focus can be obtained by an off-axis illumination method. It is noted here that the line-and-space pattern is hereinafter referred to as an L/S pattern. In the off-axis illumination method, a normal-incidence component is cut off from mask illumination light so that a mask is illuminated with oblique-incidence light. In a normal image formation, three beams of a zeroth-order diffracted light beam, a positive first-order diffracted light beam, and a negative first-order diffracted light beam are condensed from a mask pattern by a projection lens (image formation of three-beam interference).

In contrast to the normal image formation, in another off-axis illumination, one of positive and negative first-order diffracted light beams is discarded (or cut off so that it does not enter a projection lens). Thus, an image is formed by two beams of a zeroth-order light beam and one of the positive and negative first-order diffracted light beams (image formation of two-beam interference). When images formed by the three-beam interference and the two-beam interference are compared in their best focused conditions, a contrast of the image formed by the two-beam interference is lower than that of the image formed by the three-beam interference because one of the positive and negative first-order diffracted light beams has been discarded. However, when an angle of incidence on an image formation surface (semiconductor substrate) is taken into consideration, the image formed by the two-beam interference has an angle of incidence that is a half of an angle of incidence of the image formed by the three-beam interference. Accordingly, the two-beam interference has a smaller degree of defocus when an image is out of focus. Thus, the two-beam interference can obtain a light intensity distribution that is sufficient to form a resist pattern with a wide focus range.

It has been known that a depth of focus (a focus range in which a resist pattern can be obtained) can be increased by the use of a half-tone phase shift mask. In the half-tone phase shift mask, a mask pattern being a light shield region is formed as a semitransparent region so that 2% to 20% of light leaks. The phases of the leaked light and the light passing through the peripheral transparent region are inversed by 180°. In a case of a line-and-space pattern that produces diffracted light, the balance between the zeroth-order diffracted light and the positive (or negative) first-order diffracted light can be improved by the use of a half-tone mask and off-axis illumination. As a consequence, the contrast can be increased.

However, the off-axis illumination method is less effective in an isolated pattern, which produces no diffracted light. Accordingly, a depth of focus is not largely increased. Conversely, reduction of NA or σ is more effective in order to increase a depth of focus in an isolated pattern. Reduction of NA means that a mask is illuminated with light close to vertical components. In case where a half-tone phase shift mask is used, reduction of σ is more effective in improvement of a depth of focus. These conditions to increase a depth of focus in an isolated pattern result in a lowered resolution of a dense pattern. Accordingly, it has been difficult to maintain exposure characteristics of both a dense fine pattern and an isolated pattern. Under theses circumstances, a method using a fine pattern called an auxiliary pattern, which does not serve to resolve an image, has been developed to obtain a depth of focus in both a dense pattern and an isolated pattern.

For example, Japanese laid-open patent publication No. 4-268714, which is hereinafter referred to as Patent Document 1, discloses auxiliary patterns (page 3; FIGS. 4(a) and 4(b)). According to Patent Document 1, when fine hole patterns and slit patterns are to be formed by off-axis illumination, a depth of focus can be increased by arranging auxiliary patterns so that the hole patterns and slit patterns approach a periodic pattern. Furthermore, Patent Document 1 discloses that the same effects can also be obtained in line patterns. When a mask including auxiliary patterns is used under off-axis illumination conditions, an image is nearly formed by two-beam interference so that a depth of focus is increased. Upon arranging auxiliary patterns, the position and dimension of the auxiliary patterns give an influence on a depth of focus in a device pattern. An optimum value of a space between an auxiliary pattern and a main pattern varies depending upon their dimensions and applied optical conditions. However, an appropriate range of a space between an auxiliary pattern and a main pattern is from a dimension corresponding to a limit of resolution of optical conditions (½ of a pitch of an L/S pattern to be formed) to about 1.5 times that dimension.

Moreover, Japanese laid-open patent publication No. 5-002261, which is hereinafter referred to as Patent Document 2, discloses a combination of off-axis illumination and a half-tone phase shift mask to improve reduction of a contrast in image formation of two-beam interference (page 3; FIG. 1). In the image formation of two-beam interference, one of positive and negative light beams is cut off. Accordingly, the zeroth-order diffracted light, which has information on average brightness, becomes excessively strong relative to the positive (or negative) first-order diffracted light, which has information on pitches. Therefore, an amplitude of peak/bottom is smaller than an average value in a light intensity distribution. Thus, a contrast of the light intensity is lowered. By using a half-tone phase shift mask, intensity of the zeroth-order diffracted light can be reduced. In this manner, intensity of the zeroth-order light and the positive (or negative) first-order light can properly be adjusted so as to improve a contrast of the light intensity.

The following patent documents describe technology to further improve the resolution. Japanese laid-open patent publication No. 3-071133, which is hereinafter referred to as Patent Document 3, discloses auxiliary patterns of phase shift layers disposed adjacent to isolated patterns. Japanese laid-open patent publication No. 6-242594, which is hereinafter referred to as Patent Document 4, discloses that auxiliary patterns each having a width SW not more than a minimum line width P/2 are arranged at distances S from isolated patterns so that a relationship of P/2<S<(P-SW) is satisfied. Japanese laid-open patent publication No. 2004-348118, which is hereinafter referred to as Patent Document 5, discloses auxiliary patterns corresponding to hole patterns. However, both of these auxiliary patterns and optical proximity correction (OPC) are used in the current optical lithography for achieving a high level of fineness. Accordingly, it has been desired to optimize both of auxiliary patterns and OPC in order to provide fine patterns.

SUMMARY OF THE INVENTION

When mask data are produced, auxiliary patterns are arranged with respect to CAD data into which a device pattern has been inputted. Then, an OPC process is performed. Auxiliary patterns are generally arranged by first generating auxiliary patterns corresponding to all sides of a device pattern in accordance with a predetermined rule and then deleting portions at which the auxiliary patterns are close to the device pattern and portions at which the auxiliary patterns are close to each other. Thereafter, an OPC process is performed on the device pattern in which the auxiliary patterns have been arranged so as to generate a final mask data such that a pattern to be transferred onto a semiconductor substrate has a desired dimension.

The methods of OPC are generally classified into a rule-based method and a model-based method. The model-based OPC is commonly used at the present time. In the model-based OPC, each side of a device pattern is divided, and an evaluation point is set for each divided side. Simulation is performed to calculate a dimension when the evaluation points are transferred onto a wafer. Then, each divided side is moved so that each evaluation pattern has a desired dimension. Accordingly, in final data to generate a mask, spaces between the device pattern and the auxiliary patterns are changed by the OPC process. Particularly, a tip of a line pattern is likely to be tapered when the line pattern is transferred onto a semiconductor substrate. Therefore, a large amount of correction is added to the tip of the line pattern by the OPC process. Accordingly, a space between the tip of the line pattern and an auxiliary pattern that has been arranged before the OPC process becomes excessively small and thus causes an improper situation.

When super-resolution technology such as an annular illumination or a phase shift mask is not used, a peripheral pattern can be formed so as to have a desired dimension simply by arranging an auxiliary pattern. Accordingly, even if an OPC process is performed on data after the auxiliary pattern has been arranged, only a small amount of correction is added to the tip of the line pattern. Thus, a space between the tip of the line pattern and the auxiliary pattern is not changed to a large extent. In this manner, it is not necessary to consider the tip of the line pattern. However, when super-resolution technology such as off-axis illumination is used for a long life of optical lithography, a taper of a peripheral pattern and a shrinkage of a line end are extremely increased. Thus, when the current super-resolution technology is used, a large amount of correction is added so that a space between the tip of the line pattern and the auxiliary pattern arranged before the OPC process becomes inappropriate. As a result, suitable auxiliary pattern and OPC pattern cannot be obtained.

The present invention has been made in view of the above drawbacks. It is, therefore, an object of the present invention to provide a mask data generation method capable of obtaining optimized auxiliary patterns and OPC pattern, and a mask including optimized auxiliary patterns and OPC pattern. According to the present invention, when auxiliary patterns are to be arranged with respect to a device pattern, an arrangement rule for a tip of the device pattern is designed to be different from that for other portions. For portions that are corrected to a large extent by an OPC process, such as the tip of the device pattern, an auxiliary pattern is spaced at an increased distance from the device pattern. Specifically, a distance at which an auxiliary pattern is spaced from the tip of the device pattern is set to be longer than a distance at which an auxiliary pattern is spaced from a side of the device pattern. With different distances between the auxiliary patterns and the device pattern, it is possible to adjust spaces between the device pattern and the auxiliary patterns in an appropriate range after an OPC process. With such an arrangement of auxiliary patterns, it is possible to obtain optimized auxiliary patterns and an optimized OPC pattern.

In order to resolve the above problem, the present invention basically adopts the following technology. As a matter of course, the present invention covers applied technology in which various changes and modifications are made therein without departing from the spirit of the present invention.

A mask data generation method according to the present invention includes an auxiliary pattern arrangement step of arranging auxiliary patterns adjacent to a device pattern and an OPC step of performing an OPC process. A distance at which the auxiliary pattern is spaced from a short side of the device pattern in the auxiliary pattern arrangement step is set to be longer than a distance at which the auxiliary pattern is spaced from a long side of the device pattern in the auxiliary pattern arrangement step.

The distance at which the auxiliary pattern is spaced from the short side of the device pattern may vary depending upon a dimension of the short side of the device pattern.

The distance at which the auxiliary pattern is spaced from the short side of the device pattern may be predetermined with a table lookup method by a dimension of the short side of the device pattern.

The distance at which the auxiliary pattern is spaced from the short side of the device pattern may be in a range from a minimum dimension to 1.6 times the minimum dimension.

The auxiliary pattern spaced from the short side of the device pattern may be located a minimum separation dimension away from a position of an OPC pattern obtained by an OPC process without the auxiliary patterns.

A mask according to the present invention is produced by the aforementioned mask data generation method.

According to the present invention, when auxiliary patterns are to be arranged with respect to a device pattern, an arrangement rule for a tip of the device pattern is designed to be different from that for other portions. For portions that are corrected to a large extent by an OPC process, such as the tip of the device pattern, an auxiliary pattern is spaced at an increased distance from the device pattern. Specifically, a distance at which an auxiliary pattern is spaced from the tip (a short side) of the device pattern is set to be longer than a distance at which an auxiliary pattern is spaced from a long side of the device pattern. With different distances between the auxiliary patterns and the device pattern, it is possible to adjust spaces between the device pattern and the auxiliary patterns in an appropriate range after an OPC process. With such an arrangement of auxiliary patterns, it is possible to obtain optimized auxiliary patterns and an optimized OPC pattern. With the optimized auxiliary patterns and OPC pattern, a depth of focus can be increased so that dimensional changes due to defocus are reduced. As a result, it is possible to obtain a mask data generation method suitable for the fineness and a mask produced by such a generation method.

The above and other objects, features, and advantages of the present invention will be apparent from the following description when taken in conjunction with the accompanying drawings which illustrate preferred embodiments of the present invention by way of example.

DETAILED DESCRIPTION OF THE PREFERRED EMBODIMENTS

Embodiments of the present invention will be described below with reference to FIGS. 1 through 11.

First Embodiment

Figure 1:
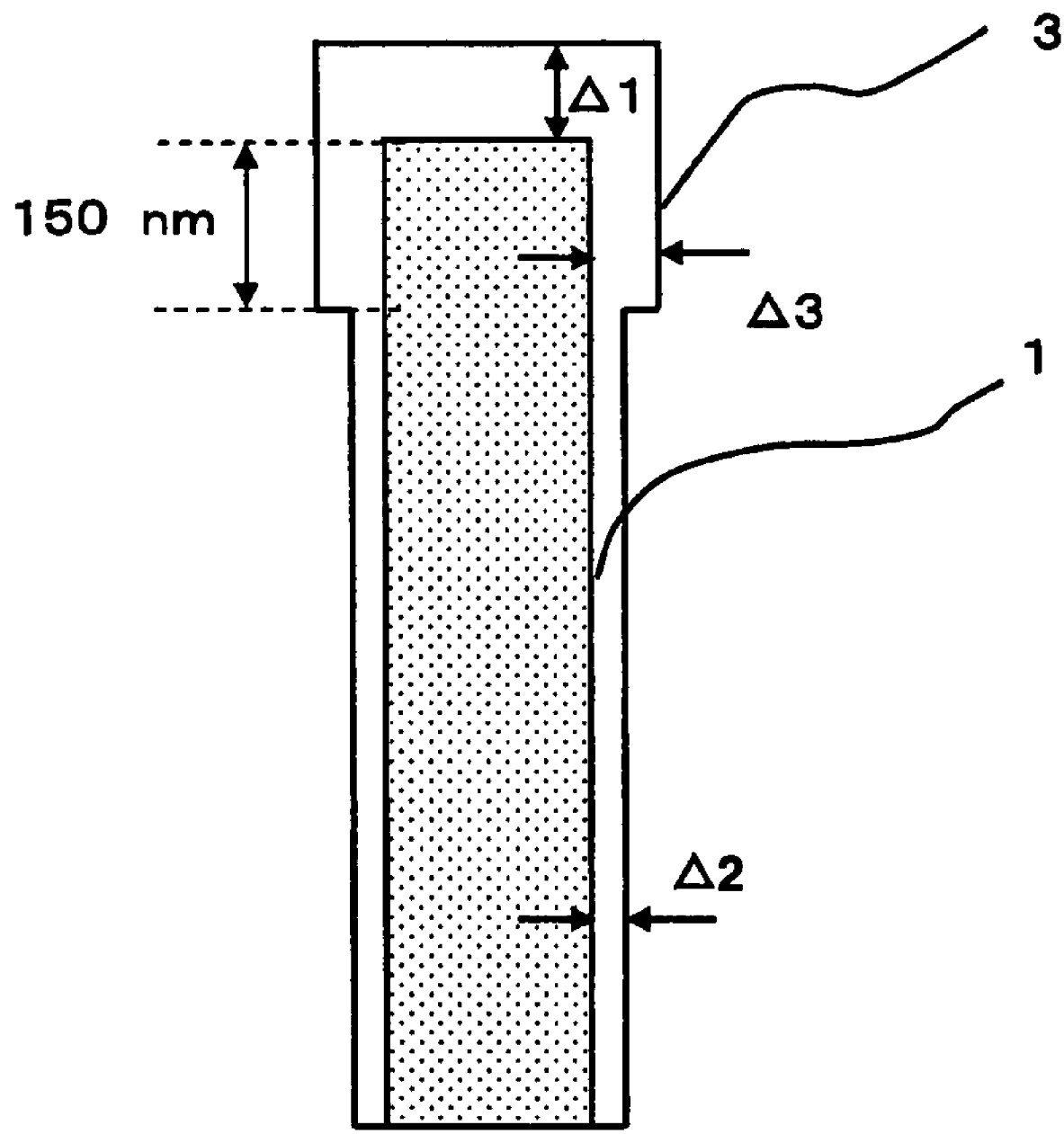
FIG. 1 is a pattern diagram showing a line pattern and an OPC pattern.
Figure 2:
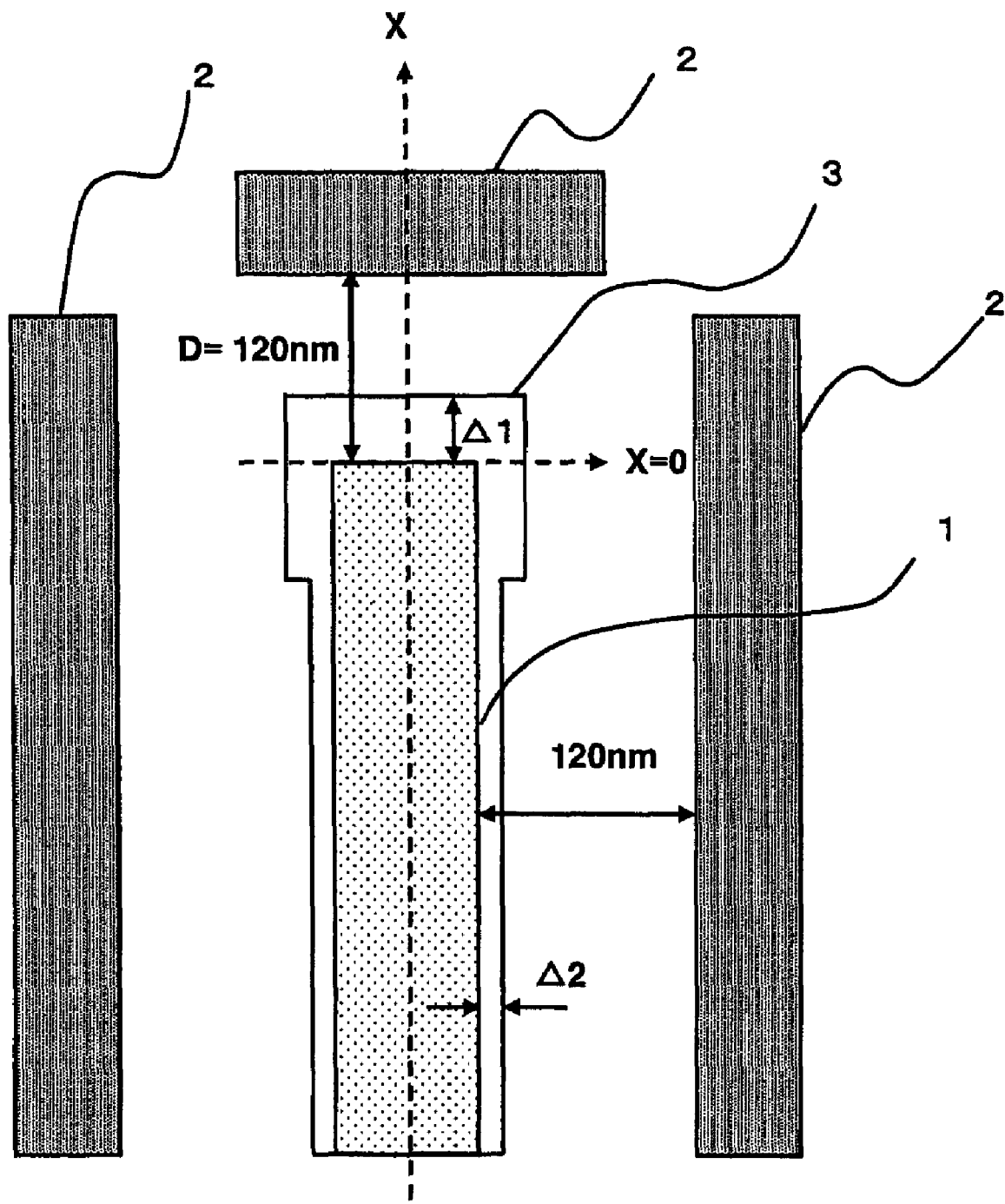
FIG. 2 is a pattern diagram showing a line pattern subjected to an OPC process in a state such that auxiliary patterns are spaced at 120 nm from the line pattern.
Figure 3:
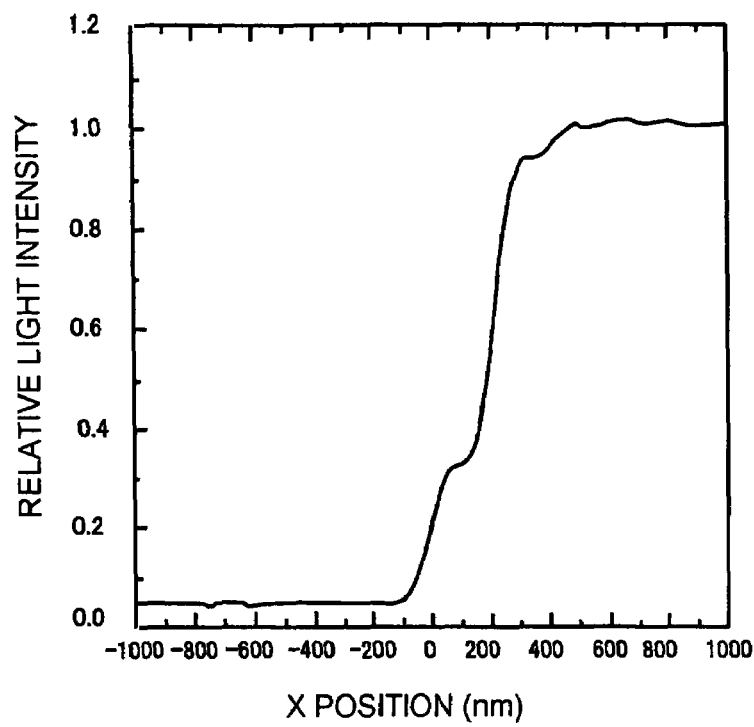
FIG. 3 is a graph showing a light intensity distribution on line X in a case where an OPC process was performed in a state such that auxiliary patterns were spaced at 120 nm from a line pattern having a width of 180 nm.
Figure 4:
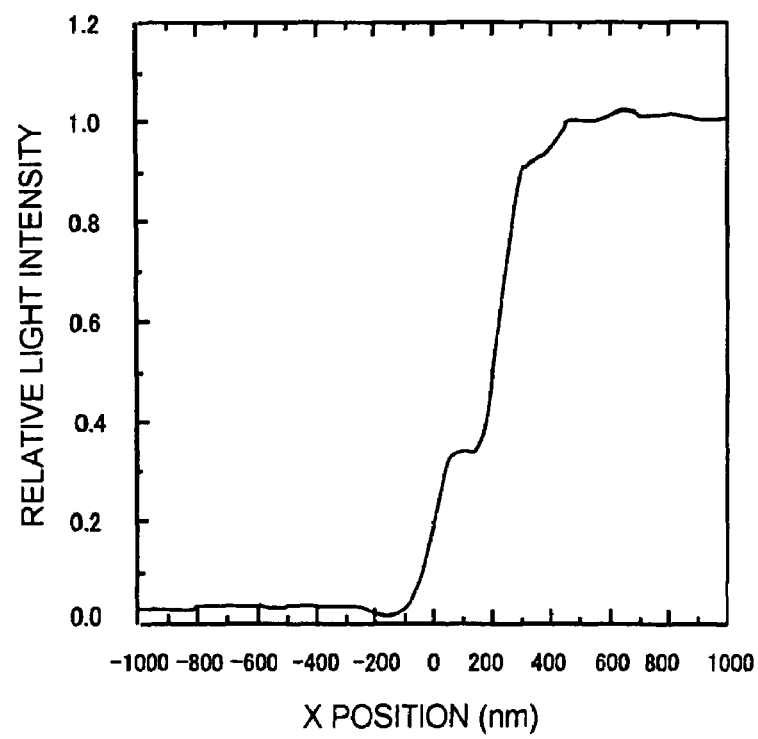
FIG. 4 is a graph showing a light intensity distribution on line X in a case where an OPC process was performed in a state such that an auxiliary pattern was spaced at 120 nm from a short side of a line pattern having a width of 220 nm.
Figure 5:
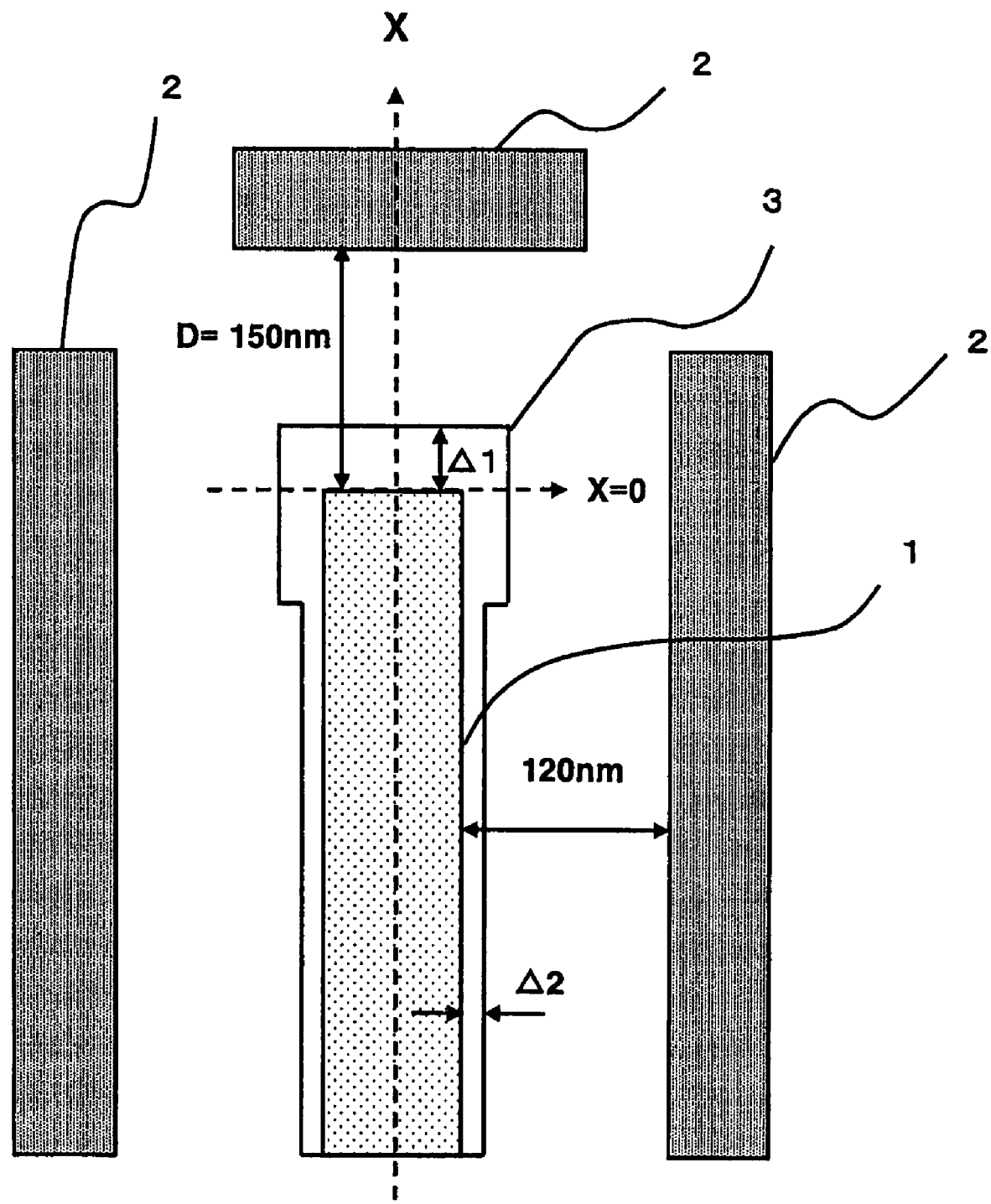
FIG. 5 is a pattern diagram showing a line pattern subjected to an OPC process in a state such that an auxiliary pattern is spaced at 150 nm from a short side of the line pattern, which has a width of 120 nm.
Figure 6:
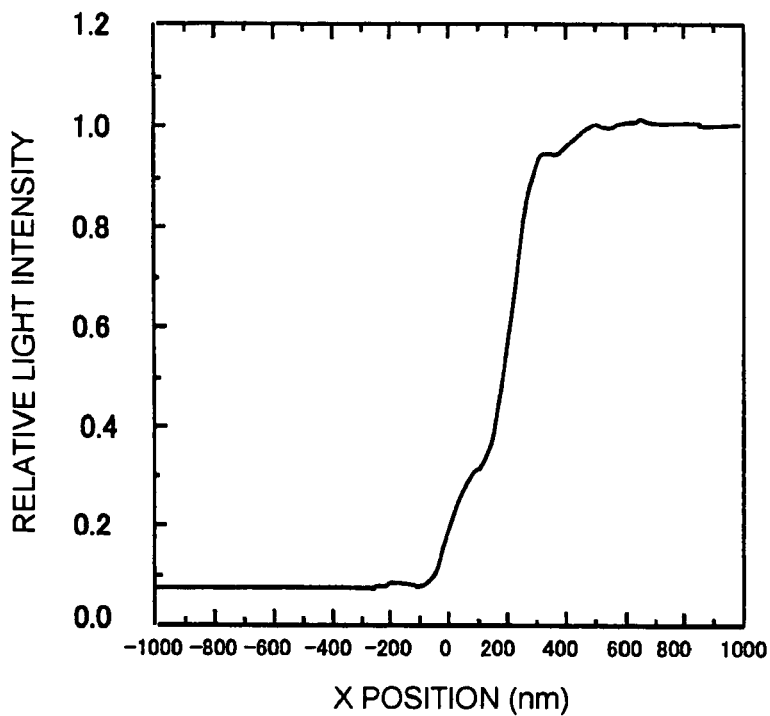
FIG. 6 is a graph showing a light intensity distribution on line X in a case where an OPC process was performed in a state such that auxiliary patterns were spaced at 120 nm from a line pattern having a width of 120 nm.
Figure 7:
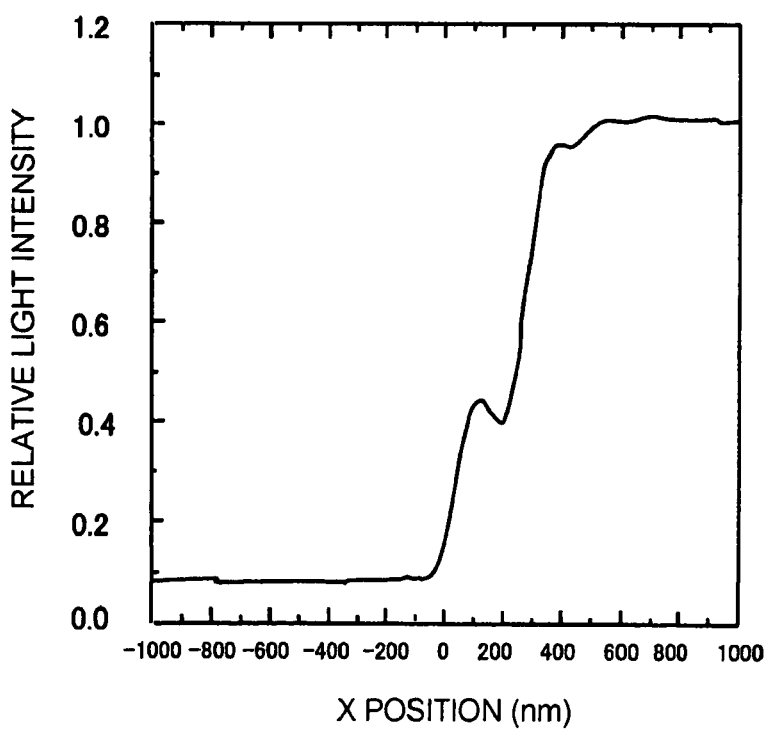
FIG. 7 is a graph showing a light intensity distribution on line X in a case where an OPC process was performed in a state such that an auxiliary pattern was spaced at 150 nm from a short side of a line pattern having a width of 120 nm.

A first embodiment of the present invention will be described below with reference to FIGS. 1 through 7. FIG. 1 is a pattern diagram showing a line pattern 1 and an OPC pattern 3. FIG. 2 is a pattern diagram showing a line pattern 1 subjected to an OPC process in a state such that auxiliary patterns 2 are spaced at 120 nm from the line pattern 1. FIG. 3 is a graph showing a light intensity distribution on line X in a case where an OPC process was performed in a state such that auxiliary patterns were spaced at 120 nm from a line pattern having a width of 180 nm. FIG. 4 is a graph showing a light intensity distribution on line X in a case where an OPC process was performed in a state such that an auxiliary pattern was spaced at 120 nm from a short side of a line pattern having a width of 220 nm. FIG. 5 is a pattern diagram showing a line pattern 1 subjected to an OPC process in a state such that an auxiliary pattern 2 is spaced at 150 nm from a short side of the line pattern 1, which has a width of 120 nm. FIG. 6 is a graph showing a light intensity distribution on line X in a case where an OPC process was performed in a state such that auxiliary patterns were spaced at 120 nm from a line pattern having a width of 120 nm. FIG. 7 is a graph showing a light intensity distribution on line X in a case where an OPC process was performed in a state such that an auxiliary pattern was spaced at 150 nm from a short side of a line pattern having a width of 120 nm.

In the present embodiment, it is assumed that an annular illumination having a numerical aperture (NA) of 0.85, a coherent factor ($\sigma$) of 0.85, and a shading rate of ¾ is used to form a line-and-space pattern of 100 nm with KrF exposure having a wavelength of 248 nm. Furthermore, it is assumed that an isolated pattern arranged with auxiliary patterns has a dimension of 100 nm to 400 nm and that a half-tone phase shift mask having a transmittance of 6% and a phase difference of 180° is used as a mask. In this example, a minimum dimension is 100 nm. The minimum dimension is defined as a half of a pitch of an L/S pattern that can productively be formed with a sufficient depth of focus.

Table 1 shows the amounts of correction in a case where an OPC process was performed without arranging auxiliary patterns. A threshold of OPC, which is a light intensity at the time when a resist shape is calculated, was set so that a line-and-space pattern of 100 nm had a desired dimension. Isolated patterns having a minimum line dimension of 100 nm to 400 nm and a length of 5000 nm were used. In the OPC process, the pattern was divided into fine segments, and a target point was provided at the center of each segment. The light intensity was calculated at the target point. Each segment was moved so that the target point was located at a designed position. In this example, since the minimum line width was 100 nm, a tip segment was set as L=150 nm.

The degree to which the line is tapered is larger at a tip of the line as shown in FIG. 1. Accordingly, the illustrated amounts of correction include an amount of correction $\Delta 1$ at the tip of the line (on a short side), an amount of correction $\Delta 2$ at a central portion on a long side of the line, and an amount of correction $\Delta 3$ at the tip of the line (on the long side). The amount of correction $\Delta 1$ on the short side at the tip of the line is large. The amount of correction $\Delta 3$ on the long side at the tip of the line is smaller than the amount of correction $\Delta 1$. The amount of correction $\Delta 2$ at a central portion on the long side of the line is smaller than the amount of correction $\Delta 3$. FIG. 1 shows the OPC pattern 3 on only one end of the line pattern 1. The OPC pattern is also formed on the other end of the line pattern 1, which is not illustrated in FIG. 1. The pattern on the other side may be omitted from the following drawings as needed. In the following description, the long side of the device pattern may be simply referred to as a side, and the short side at the tip of the device pattern may be simply referred to as a tip.

TABLE 1

| | Line Dimension | | | | | | | | | | | [Unit: nm] |
|---|---|---|---|---|---|---|---|---|---|---|---|---|
| | 100 | 120 | 140 | 160 | 180 | 200 | 220 | 240 | 260 | 300 | 400 | |
| Δ1 | 66 | 58 | 53 | 49 | 45 | 44 | 41 | 38 | 36 | 30 | 30 | |
| Δ2 | 37 | 36 | 35 | 33 | 31 | 30 | 28 | 27 | 25 | 19 | 19 | |
| Δ3 | 43 | 42 | 41 | 39 | 38 | 34 | 33 | 33 | 33 | 32 | 28 | |

As shown in FIG. 2, auxiliary patterns 2 are tentatively arranged with respect to the line pattern 1, and an OPC process is performed. The auxiliary patterns 2 have a width of 60 nm and a length larger than that of the line pattern 1 so that the auxiliary patterns 2 are not transferred. A space between the auxiliary patterns 2 and the line pattern 1 is set to be 120 nm so that the pitch is 200 nm, which is the same as a pitch of a line-and-space having a minimum dimension of 100 nm. The auxiliary patterns 2 are arranged on the right and left sides of the line and on the upper and lower sides of the line. Table 2 shows the amounts of correction in a case where an OPC process was performed in a state such that auxiliary patterns were spaced at 120 nm from a line pattern. The listed amounts of correction include an amount of correction Δ1 at a tip of the line (on a short side) and an amount of correction Δ2 at a central portion on a long side of the line. In the following description, the amount of correction Δ3 at the tip of the line (on the long side), which is shown in FIG. 1, is omitted for the sake of clarity.

line width of 220 nm. In the light intensity distribution shown in FIG. 3 for the line dimension of 180 nm, images of the line pattern 1 and the auxiliary pattern 2 could not be separated from each other. On the other hand, in the light intensity distribution shown in FIG. 4 for the line dimension of 220 nm, a peak appeared between a dark portion of the line pattern 1 and a dark portion of the auxiliary pattern 2, so that the two patterns could be separated from each other. A minimum space between the OPC pattern 3 and the auxiliary pattern 2 that produces a peak therebetween and allows the two patterns to be separated from each other is referred to as a minimum separation dimension. In the case where the space of 93 nm was formed between the OPC pattern 3 and the auxiliary pattern 2, the two patterns were not separated from each other. In the case where the space of 99 nm was formed between the OPC pattern 3 and the auxiliary pattern 2, the two patterns (the line pattern 1 and the auxiliary pattern 2) were separated from each other. Accordingly, the minimum separation dimension was about 95 nm.

TABLE 2

| | Line Dimension | | | | | | | | | | | [Unit: nm] |
|---|---|---|---|---|---|---|---|---|---|---|---|---|
| | 100 | 120 | 140 | 160 | 180 | 200 | 220 | 240 | 260 | 300 | 400 | |
| Δ1 | 54 | 43 | 36 | 30 | 27 | 25 | 21 | 17 | 17 | 13 | 7 | |
| Δ2 | 13 | 13 | 13 | 12 | 10 | 7 | 6 | 4 | 4 | 4 | 0 | |

The dimension of the side of the line pattern is close to a design dimension by arrangement of the auxiliary patterns. Accordingly, the amount of correction Δ2 is largely reduced by the OPC process. On the other hand, the dimension of the tip of the thin line is hardly changed by addition of the auxiliary patterns. Accordingly, a large amount of correction Δ1 should be added by the OPC process to obtain a desired shape. Therefore, a space between the auxiliary pattern 2 and the OPC pattern 3 becomes as small as 120−54=66 nm at the tip of the line having a line width of 100 nm. This dimension is inappropriate.

FIGS. 3 and 4 show light intensity distributions at tips of the lines having a width of 180 nm and 220 nm, respectively, as listed in Table 2. These light intensity distributions were on the X-axis shown in FIG. 2. An edge of the line tip was located at a position X=0. Negative values on the X-axis represent the interior of the line pattern 1 while positive values represent the exterior of the line pattern 1. A space between the auxiliary pattern 2 and the OPC pattern 3 was 93 nm in the case of the line width of 180 nm. A space between the auxiliary pattern 2 and the OPC pattern 3 was 99 nm in the case of the If the line pattern 1 and the auxiliary pattern 2 are not separated from each other in a light intensity distribution as shown in FIG. 3, the purpose of the auxiliary pattern 2 for reducing dimensional changes due to defocus by approaching to a periodic pattern cannot be achieved. Accordingly, a space between the line pattern 1 and the auxiliary pattern 2 should be at least 95 nm, which is the minimum separation dimension, when an OPC process is performed after the auxiliary patterns 2 are arranged. In this example, it is assumed that the minimum dimension of 100 nm is maintained. The amount of correction at the tip of the line listed in Table 2 is rounded up to the nearest 10 nm. The rounded amount is added to the minimum dimension of 100 nm to obtain a distance (D) at which an auxiliary pattern 2 is spaced from the line tip. Table 3 shows distances (D) for respective line dimensions when the auxiliary pattern 2 is arranged with respect to the line tip according to the present invention. These distances (D) range from the minimum dimension (100 nm in this example), which provides stable formation with a sufficient depth of focus, to about 1.6 times the minimum dimension.

TABLE 3

| | Line Dimension | | | | | | | | | | [Unit: nm] |
|---|---|---|---|---|---|---|---|---|---|---|---|
| | 100 | 120 | 140 | 160 | 180 | 200 | 220 | 240 | 260 | 300 | 400 |
| D | 160 | 150 | 140 | 130 | 130 | 130 | 130 | 120 | 120 | 120 | 110 |

Referring to FIG. 5, an auxiliary pattern 2 is spaced at a distance (D) of 150 nm from a tip of an isolated line having a width of 120 nm. An auxiliary pattern is spaced at a distance (D) of 110 nm from a tip of an isolated line having a width of 400 nm. Thus, for a thinner line, an OPC process is performed in a state such that the auxiliary pattern 2 is spaced at a longer distance from a tip of a target pattern. Table 4 shows the amounts of correction in an OPC process performed after the auxiliary pattern 2 was disposed so as to face the line tip. The listed amounts of correction include an amount of correction Δ1 at the tip of the line (on a short side) and an amount of correction Δ2 at a central portion on a long side of the line.

TABLE 4

| | Line Dimension | | | | | | | | | | [Unit: nm] |
|---|---|---|---|---|---|---|---|---|---|---|---|
| | 100 | 120 | 140 | 160 | 180 | 200 | 220 | 240 | 260 | 300 | 400 |
| Δ1 | 64 | 52 | 42 | 38 | 34 | 32 | 21 | 17 | 17 | 13 | 7 |
| Δ2 | 13 | 13 | 13 | 12 | 10 | 7 | 6 | 4 | 4 | 4 | 0 |

Next, effects of a mask generated by a mask data generation method according to the present invention will be described below. FIGS. 6 and 7 show light intensity distributions at tips of lines having a width of 120 nm. FIG. 6 shows a case in which an OPC process was performed in a state such that an auxiliary pattern 2 was spaced at 120 nm from the line tip in addition to auxiliary patterns 2 facing long sides of the line as shown in FIG. 2. FIG. 7 shows a case in which an auxiliary pattern 2 was spaced at 150 nm from the line tip as shown in FIG. 5. As shown in FIG. 7, images of a line pattern 1 and an auxiliary pattern 2 could be separated from each other by widening a space between the auxiliary pattern 2 and the line pattern 1. Thus, the light intensity distribution could be approached to a peripheral pattern after the OPC process.

When an auxiliary pattern 2 was spaced at 120 nm from the line tip, an end of the line was shrunk by 13/57 nm in a case of a defocus of 0.1/0.2 μm. When an auxiliary pattern 2 was spaced at 150 nm from the line tip, an end of the line was shrunk by 9/49 nm in a case of a defocus of 0.1/0.2 μm. The shrinkage of the line end was measured in the following manner. First, a light intensity (I) was read on the line end X=0 in a light intensity waveform at a defocus of 0 μm. Then, a light intensity was measured in a defocused state, and an X position having a light intensity (I) was read from this waveform. The change of the X position was a shrinkage of the line end.

With a defocus of 0.1/0.2 μm, the shrinkage of the tip of the pattern in the case where the auxiliary pattern 2 was spaced at 150 nm from the line tip was smaller than that in the case where the auxiliary pattern 2 was spaced at 120 nm. Thus, dimensional changes due to defocus could be reduced by performing an OPC process in a state such that an auxiliary pattern 2 was spaced at 150 nm from the line tip. In this manner, dimensional changes due to defocus can be reduced by approaching a light intensity distribution at the line tip to a periodic pattern.

Generally, auxiliary patterns 2 are spaced at the same distance from a long side and a short side of the line pattern 1 as shown in FIG. 2 and Table 2. According to the present invention, auxiliary patterns 2 are spaced at different distances from a long side and a short side of the line pattern 1. Specifically, a distance at which an auxiliary pattern 2 is spaced from the short side of the line pattern 1 is set to be longer than a distance at which an auxiliary pattern 2 is spaced from the long side of the line pattern 1. The amount of correction in the case where an OPC process is performed in such a state that an auxiliary pattern 2 is disposed in the distance becomes larger than the amount of correction Δ1 listed in Table 2. Accordingly, a minimum dimension (100 nm) larger than a minimum separation dimension (95 nm), which is desired to be maintained, is added to the amount of correction Δ1 to obtain distances D listed in Table 3.

A distance at which an auxiliary pattern 2 is spaced from the short side of the line pattern 1 can also be calculated in the following manner. The amount of correction Δ1 in the case where an OPC process is performed without arranging auxiliary patterns 2 as listed in Table 1 is used in this method. The amount of correction in the case where an OPC process is performed without auxiliary patterns 2 is always larger than the amount of correction in the case where auxiliary patterns are arranged. A minimum required separation dimension (95 nm) is added to the amount of correction Δ1 to obtain a distance at which an auxiliary pattern 2 is spaced from the tip (short side) of the line pattern 1.

In the present embodiment, when auxiliary patterns 2 are arranged with respect to the device pattern, an arrangement rule for the tip of the line pattern 1 is designed to be different from that for other portions. For portions that are corrected to a large extent by an OPC process, such as the tip of the line pattern 1, an auxiliary pattern 2 is spaced at an increased distance from the device pattern. When a distance at which an auxiliary pattern 2 is spaced from the short side of the device pattern is set to be longer than a distance at which an auxiliary pattern 2 is spaced from the long side of the device pattern, it is possible to adjust spaces between the device pattern and the auxiliary patterns 2 in an appropriate range after an OPC process. With such an arrangement of auxiliary patterns 2, it is possible to obtain optimized auxiliary patterns 2 and an optimized OPC pattern 3. By arranging the optimized auxiliary patterns 2 and OPC pattern 3, a depth of focus can be increased so that dimensional changes due to defocus are reduced. As a result, it is possible to obtain a mask data generation method suitable for the fineness and a mask produced by such a generation method.

Second Embodiment

Figure 8:
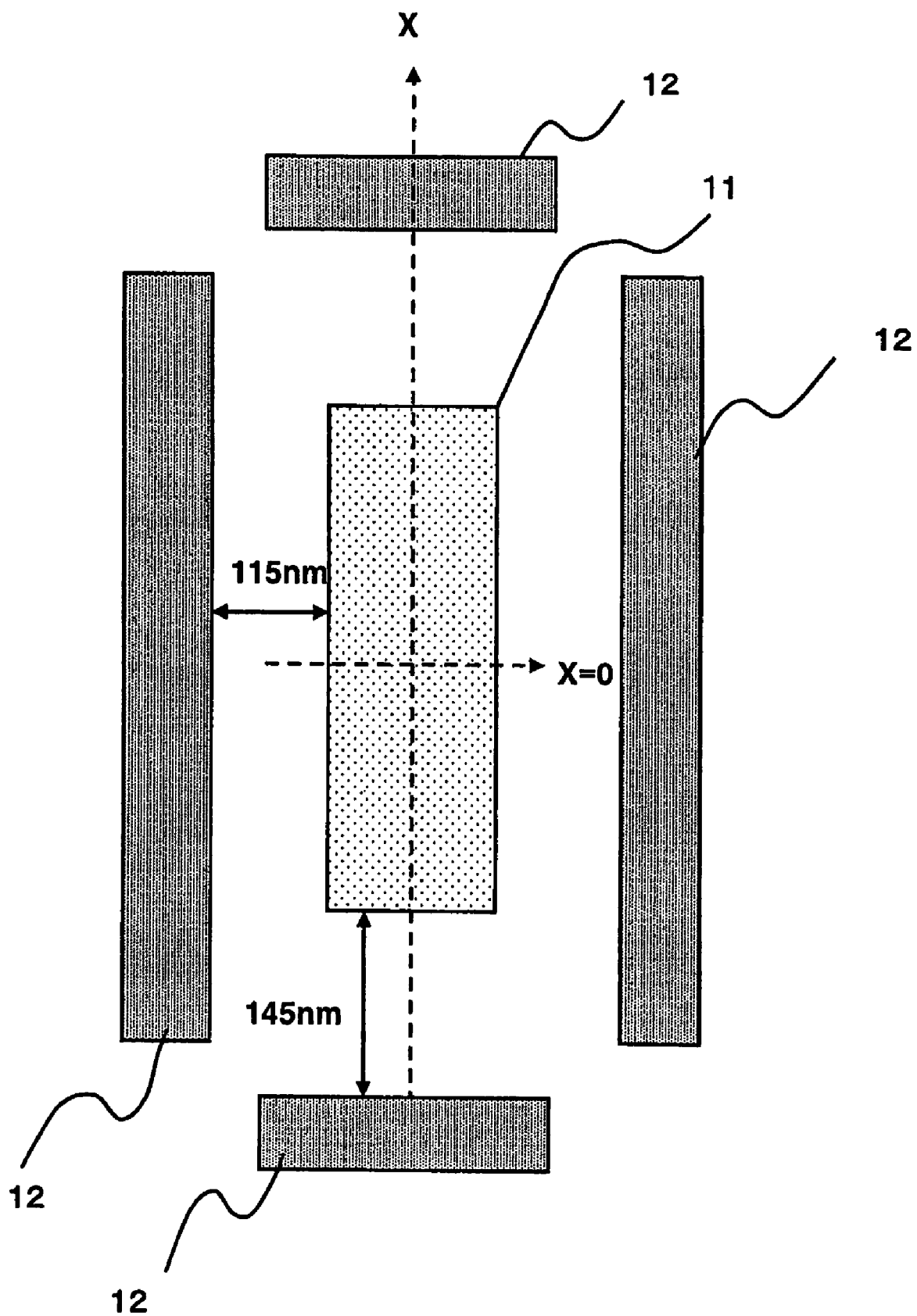
FIG. 8 is a pattern diagram showing a slit pattern and auxiliary patterns.
Figure 9:
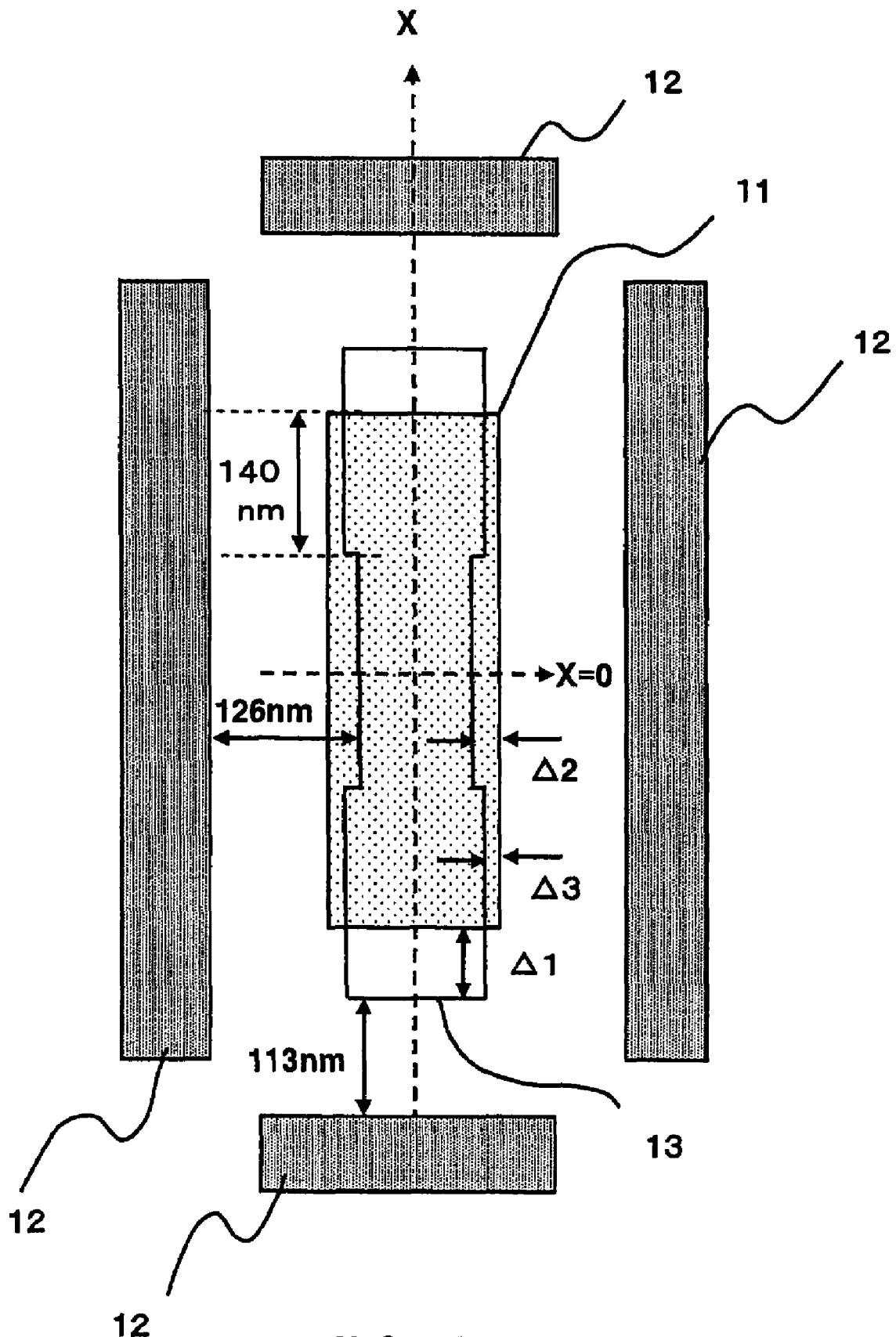
FIG. 9 is a pattern diagram showing auxiliary patterns and an OPC pattern arranged with respect to a slit pattern.
Figure 10:
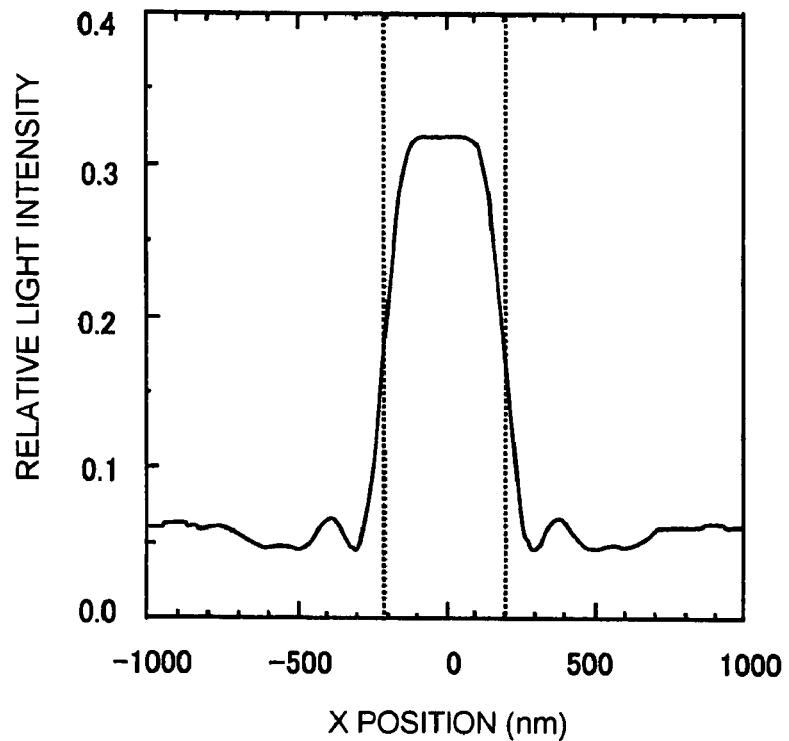
FIG. 10 is a graph showing a light intensity distribution on line X in a case where an OPC process was performed in a state such that an auxiliary pattern was spaced at 145 nm from a short side of a slit pattern.
Figure 11:
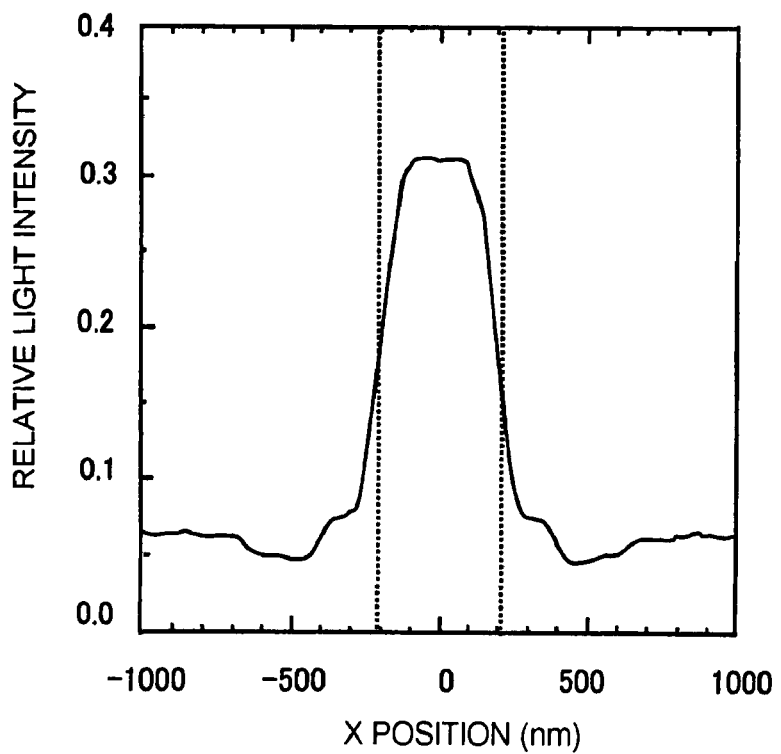
FIG. 11 is a graph showing a light intensity distribution on line X in a case where an OPC process was performed in a state such that an auxiliary pattern was spaced at 115 nm from a short side of a slit pattern.

A second embodiment of the present invention will be described below with reference to FIGS. 8 to 11. In this embodiment, the present invention is applied to a slit pattern. FIG. 8 is a pattern diagram showing a slit pattern 11 and auxiliary patterns 12. FIG. 9 is a pattern diagram showing a slit pattern 11, auxiliary patterns 12, and an OPC pattern 13. FIG. 10 is a graph showing a light intensity distribution on line X in a case where an auxiliary pattern 12 was spaced at 145 nm from a short side of a slit pattern 11. FIG. 11 is a graph showing a light intensity distribution on line X in a case where an auxiliary pattern 12 was spaced at 115 nm from a short side of a slit pattern 11.

In the present embodiment, optical lithography using a KrF excimer laser (a wavelength of 248 nm) is used as in the first embodiment. An annular illumination having a numerical aperture (NA) of 0.85, a coherent factor ($\sigma$) of 0.85, and a shading rate of ¾ is used as optical conditions. Furthermore, it is assumed that a half-tone phase shift mask having a transmittance of 6% and a phase difference of 180° is used as a mask.

FIG. 8 shows an arrangement of auxiliary patterns 12 with respect to a slit pattern 11 having short sides of 140 nm and long sides of 420 nm. The auxiliary patterns 12 are formed by fine slits having a width of 70 nm. The auxiliary patterns 12 are spaced at 115 nm from the long sides of the slit pattern 11 so that the slit pattern 11 and the auxiliary patterns 12 have a pitch of 220 nm. On the other hand, the auxiliary patterns 12 are spaced at 145 nm, which is 30 nm wider than the spaces between the long sides of the slit pattern 11 and the auxiliary patterns 12, from the short sides of the slit pattern 11. FIG. 9 shows results of an OPC process performed on data with the auxiliary patterns 12 shown in FIG. 8. The amount of correction in the OPC process is large at tips of the slit pattern 11. Accordingly, a large OPC pattern 13 is added to the tips of the slit pattern 11.

The OPC pattern 13 will briefly be described below in connection with the slit pattern 11. As with FIG. 1, the degree to which the slit pattern 11 is tapered is larger at the tips of the slit pattern 11 (on the short sides). Accordingly, the amount of correction is large at the tips of the slit pattern 11. Portions having a length of 140 nm are extracted as segments from the tips of the slit pattern 11, and the amount of correction is set to be large at these segments. As shown in FIG. 9, the amount of correction $\Delta 1$ is defined as the amount of correction at the tip of the slit pattern 11, the amount of correction $\Delta 2$ as the amount of correction at a central portion on the long side of the slit pattern 11, and the amount of correction $\Delta 3$ as the amount of correction on the long side at the tips of the slit pattern 11. In a case of no auxiliary patterns, the amount of correction $\Delta 1$ is 47 nm, the amount of correction $\Delta 2$ is −6 nm, and the amount of correction $\Delta 3$ is −4 nm. In a case where the auxiliary patterns 12 are spaced at the same distance of 115 nm from the short sides and the long sides of the slit pattern 11, the amount of correction $\Delta 1$ is 44 nm, the amount of correction $\Delta 2$ is −10 nm, and the amount of correction $\Delta 3$ is −12 nm. In a case where the auxiliary patterns 12 are spaced at 145 nm from the short sides of the slit pattern 11 and spaced at 115 nm from the long sides of the slit pattern 11, the amount of correction $\Delta 1$ is 32 nm, the amount of correction $\Delta 2$ is −11 nm, and the amount of correction $\Delta 3$ is −10 nm.

FIGS. 10 and 11 are graph showing light intensity distributions of mask data after the OPC process. FIGS. 10 and 11 show light intensity distributions on line X of FIG. 9. In FIGS. 10 and 11, the center of the slit pattern 11 was located at a position X=0. FIG. 10 shows a light intensity distribution in a case where the auxiliary patterns 12 were spaced at 145 nm from the short side of the slit pattern 11 and at 115 nm from the long side of the slit pattern 11. FIG. 11 shows a light intensity distribution in a case where the auxiliary patterns 12 were spaced at 115 nm from the short side and the long side of the slit pattern 11. When the auxiliary pattern 12 was spaced at 115 nm from the short side of the slit pattern 11, as shown in FIG. 11, a space between the OPC pattern 13 and the auxiliary pattern 12 was 71 nm, which was smaller than the minimum separation dimension. As compared to the light intensity distribution shown in FIG. 11, amplitudes of bottom/peak were produced in the light intensity distribution shown in FIG. 10. Thus, it can be seen that the light intensity distribution shown in FIG. 10 was approached to a periodic pattern. As a result, as with the line pattern 1 in the first embodiment, dimensional changes due to defocus can be reduced.

In the present embodiment, a slit pattern 11 is used as a device pattern. When auxiliary patterns 12 are to be arranged with respect to the slit pattern 11, an arrangement rule for the tip of the slit pattern 11 is designed to be different from that for other portions. For portions that are corrected to a large extent by an OPC process, such as the tip of the slit pattern 11, an auxiliary pattern 12 is spaced at an increased distance from the device pattern. When a distance at which an auxiliary pattern 12 is spaced from the tip of the device pattern is set to be longer than a distance at which an auxiliary pattern 12 is spaced from a long side of the device pattern, it is possible to form an appropriate space between the device pattern and the auxiliary patterns 12 after an OPC process. With such an arrangement of auxiliary patterns 12, it is possible to obtain optimized auxiliary patterns 12 and an optimized OPC pattern 13. By arranging the optimized auxiliary patterns 12 and OPC pattern 13, a depth of focus can be increased so that dimensional changes due to defocus are reduced. As a result, it is possible to obtain a mask data generation method suitable for the fineness and a mask produced by such a generation method.

Although certain preferred embodiments of the present invention have been shown and described in detail, the present invention is not limited to the illustrated embodiments. It should be understood that various changes and modifications may be made therein without departing from the scope of the present invention and therefore included within the scope of the present invention. For example, optical lithography using a KrF excimer laser (a wavelength of 248 nm) is used in the above embodiments. However, the present invention may be applied to other exposure wavelengths, for example, by using ArF (193 nm) or i-ray of a mercury lamp (a wavelength of 365 nm). Furthermore, instead of a half-tone phase shift mask, other phase shift masks or shielding masks may be used. A reflective mask may be used in the same manner instead of a transmissive mask.

What is claimed is:

1. A mask data generation method, comprising:
arranging first and second auxiliary patterns adjacent to a device pattern, and
performing, by a computer, an optical proximity correction (OPC) process, wherein a first distance at which the first auxiliary pattern is spaced from a short side of the device pattern is set to be longer than a second distance at which the second auxiliary pattern is spaced from a long side of the device pattern upon arranging auxiliary patterns.

2. The mask data generation method according to claim 1, wherein:
the first distance varies depending upon a dimension of the short side of the device pattern.

3. The mask data generation method according to claim 1, wherein:
the first distance is predetermined with a table lookup method by a dimension of the short side of the device pattern.

4. The mask data generation method according to claim 1, wherein:
the first distance falls within a range from a minimum dimension to 1.6 times the minimum dimension.

5. The mask data generation method according to claim 1, wherein:
the auxiliary pattern spaced from the short side of the device pattern is located a minimum separation dimension away from a position of an OPC pattern obtained by an OPC process without the auxiliary patterns.

6. A mask produced by the mask data generation method according to claim 1.

7. A mask produced by the mask data generation method according to claim 2.

8. A mask produced by the mask data generation method according to claim 3.

9. A mask produced by the mask data generation method according to claim 4.

10. A mask produced by the mask data generation method according to claim 5.

11. A mask data generation method, comprising:
arranging first and second auxiliary patterns adjacent to a device pattern, and
performing, by a computer, an optical proximity correction (OPC) process,
wherein a first distance at which the first auxiliary pattern is spaced from a first side of the device pattern is set to be longer than a second distance at which the second auxiliary pattern is spaced from a second side of the device pattern upon arranging auxiliary patterns.

12. The mask data generation method according to claim 11, wherein:
the first distance varies depending upon a dimension of the first side of the device pattern.

13. The mask data generation method according to claim 11, wherein:
the first distance is predetermined with a table lookup method by a dimension of the first side of the device pattern.

14. The mask data generation method according to claim 11, wherein:
the first distance falls within a range from a minimum dimension to 1.6 times the minimum dimension.

15. The mask data generation method according to claim 11, wherein:
the auxiliary pattern spaced from the first side of the device pattern is located a minimum separation dimension away from a position of an OPC pattern obtained by an OPC process without the auxiliary patterns.

16. A mask produced by the mask data generation method according to claim 11.

17. A mask, comprising:
first and second auxiliary patterns being arranged adjacent to a device pattern,
wherein a first distance at which the first auxiliary pattern is spaced from a first side of the device pattern is set to be longer than a second distance at which the second auxiliary pattern is spaced from a second side of the device pattern upon arranging auxiliary patterns.

18. The mask according to claim 17, wherein:
the first distance varies depending upon a dimension of the first side of the device pattern, and wherein said first side comprises a short side and said second side comprises a long side of the device pattern.

19. The mask method according to claim 17, wherein:
the first distance is predetermined with a table lookup method by a dimension of the first side of the device pattern.

20. The mask according to claim 17, wherein:
the first distance falls within a range from a minimum dimension to 1.6 times the minimum dimension.

* * * * *